United States Patent [19]  
Lesk

[11] 3,977,934  
[45] Aug. 31, 1976

[54] SILICON MANUFACTURE
[75] Inventor: Arnold Lesk, Scottsdale, Ariz.
[73] Assignee: Motorola, Inc., Chicago, Ill.
[22] Filed: Jan. 2, 1975
[21] Appl. No.: 537,984

[52] U.S. Cl. .............................. 156/608; 156/617 R; 156/620; 427/82
[51] Int. Cl.² ...................... B01J 17/18; B01J 17/10
[58] Field of Search .......................... 156/617–620, 156/621–624, 608; 427/82

[56] References Cited  
UNITED STATES PATENTS

| | | | |
|---|---|---|---|
| 3,096,158 | 7/1963 | Gaule et al. | 156/618 |
| 3,351,433 | 11/1967 | Keller | 156/617 |
| 3,413,098 | 11/1968 | Dermatis | 156/619 |
| 3,701,636 | 10/1972 | Labelle et al. | 156/619 |

Primary Examiner—Michael F. Esposito  
Attorney, Agent, or Firm—Willis E. Higgins; Harry M. Weiss

[57] ABSTRACT

A method of producing monocrystalline semiconductor material in web form from a source of polycrystalline semiconductor material. The source material is heated to form a molten zone on the end thereof, which is contacted by a thermal profile shaping member formed from the same type of semiconductor material as the semiconductor material to be produced. A monocrystalline seed crystal of the shape of the web desired then contacts the molten end of the source material near the shaping member and is withdrawn therefrom as monocrystalline semiconductor material forms on the end thereof.

4 Claims, 4 Drawing Figures

SILICON MANUFACTURE

BACKGROUND OF THE INVENTION

This invention relates to the manufacture of monocrystalline webs of semiconductor material and, more particularly, to a method of manufacture of monocrystalline webs of silicon.

One of the most common methods for pulling single crystal semiconductor material is the Czochralski method, wherein a monocrystalline rod is pulled from a melt of semiconductor material. The monocrystalline rod must then be sawed, lapped, and polished into suitable wafers for the production of semiconductor devices. Another method of producing monocrystalline semiconductor material is a "float zone" technique, wherein a monocrystalline rod is pulled from a melt within or on top of an ingot of polycrystalline material. Again, this technique produces a monocrystalline rod which must be sawed, lapped and polished to produce wafers suitable for semiconductor production.

It has previously been recognized that large savings of material could be made if monocrystalline semiconductor material could be produced directly in ribbons or strips that approximated at least one dimension of the semiconductor device to be processed. However, problems with the control of the molten region, the thermal profile, both vertical and horizontal, and growth rate have prevented various suggested ways of doing this from attaining commercial acceptability.

With the present need for new energy sources, many suggestions have revolved around the use of solar energy. One way solar energy can be utilized is with silicon solar cells whereby the radiant solar energy is converted directly to electrical energy. Systems using solar cells will require large amounts of semiconductor material, particularly silicon, if such systems are to become acceptable. Such silicon must be available at a cost far less than present costs for transistors, rectifiers, etc.

SUMMARY OF THE INVENTION

It is an object of this invention to provide an improved method for manufacture of webs of monocrystalline semiconductor material.

It is an object of the present invention to avoid the undesirable shortcomings of the prior art by providing a simple method and relatively inexpensive apparatus for producing uniform webs of monocrystalline semiconductor material.

A further object of the invention is to provide a method for rapidly and reliably growing thin webs of monocrystalline semiconductor material.

In accordance with these objects there is provided a method of producing monocrystalline semiconductor material in web form which comprises the steps of providing a source of polycrystalline semiconductor material in elongated form, heating the end thereof to produce a molten pool thereon, contacting the molten poll of semiconductor material with a thermal profile shaping member of th same semiconductor material as the material to be produced, contacting the pool near the area contacted by the thermal profile shaping member with a seed crystal of approximately the shape of the web to be formed and withdrawing the seed crystal from the pool of molten material as monocrystalline semiconductor material is grown thereon.

THE DRAWINGS

Further objects and advantages of the invention will be understood from the following complete description thereof and from the drawings wherein.

COMPLETE DESCRIPTION

Figure 1:
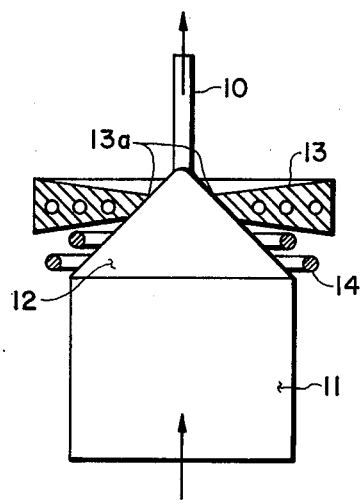
FIG. 1 is a front elevation view illustrating the method in accordance with the invention.
Figure 2:
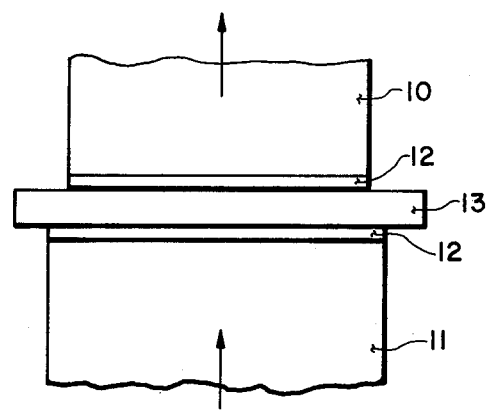
FIGS. 2 and 3 are side elevation and top plan views thereof.
Figure 3:
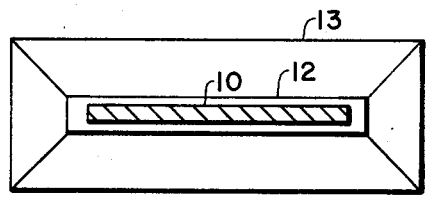

As illustrated in FIGS. 1–3, a monocrystalline web 10 is produced from a source 11 of polycrystalline semiconductor material by forming a molten region or pool 12 on the top of the source 11. The molten region 12 is contacted by a monocrystalline seed material 10 of the appropriate dimension desired and as monocrystalline semiconductor material forms on the thus produced web, the web is withdrawn from the molten region. The shape of the web to be formed is controlled by thermal profile shaping members 13 of the same type of semiconductor material as the semiconductor web to be formed. Many of the problems encountered by prior attempts to form monocrystalline semiconductor material ribbons are related to the need to control the shape of the liquid interface with the monocrystalline material being pulled while not contaminating the monocrystalline web thus formed. By using thermal profile shaping members of the same semiconductor material as the web to be formed, the problems of contamination are eliminated, while maintaining close control of the shape of the web thus formed.

The molten zone on the top of the polycrystalline source material may be produced by energy sources of many appropriate types but as shown is an induction heating coil 14, which coil could be replaced by a radiant energy source such as a laser or by heated electrical filaments.

Figure 4:
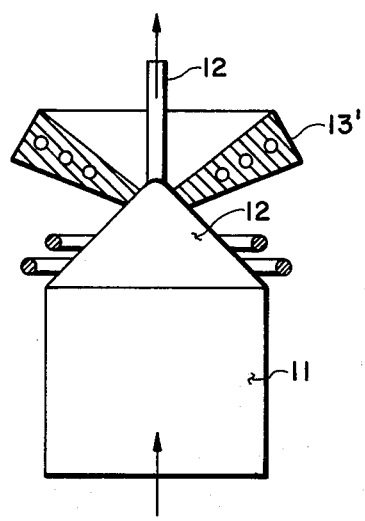
FIG. 4 is a front elevation view of a further embodiment of the invention.

The use of thermal profile shaping member 13 of the same type of semiconductor material as the web 10 permits the shaping member tips 13a to actually be incorporated as a part of the molten zone 12 and thus not merely be a liquid/solid interface between the semiconductor material and a formed substance. By providing cooling means within or on the thermal profile shaping members 13, the temperature at the tips of the thermal profile shaping member and, hence, the amount of material of the tips which become part of the molten zone may be closely controlled, and the tips of the thermal profile shaping member 13 may actually be replenished from the molten zone by decreasing the temperature thereof or more of the thermal profile shaping member may become part of the molten zone by increasing the temperature. Thus, the thermal profile shaping member may be considered as actually having molten tips forming a liquid/liquid interface with the molten zone. While the thermal profile shaping member 13 has been shown as a relatively flat member, tapered to tips at its central orifice, it may be preferable to have other shapes as, for example, shown in FIG. 4, wherein the thermal profile shaping member 13' is in the general shape of a pyramid. This permits the bulk of the thermal profile shaping member to be further removed from the heat source 14.

It will be understood that the process will be carried out in a suitable controlled atmosphere chamber which has provisions for egress of the source material 11 and exit of the single crystal web material 10. While, in general, the process is particularly applicable to the growth of silicon monocrystalline material, it might be utilized for other semiconductor materials as well.

While the invention has been described by way of the preferred embodiments thereof, it will be appreciated that certain modifications may be made therein without departing from the spirit and scope of the invention.

What is claimed is:

1. A method of producing monocrystalline semiconductor material in web form from a polycrystalline semiconductor source which comprises:

forming a molten zone of semiconductor material from said polycrystalline source, contacting the molten zone with a thermal profile shaping member of the same material as the semiconductor material to be produced, drawing monocrystalline semiconductor material from said molten zone through said thermal shaping member, and replenishing said molten zone from said polycrystalline semiconductor material source as said monocrystalline semiconductor material is drawn from said molten zone.

2. A method as recited in claim 1 wherein said semiconductor material is silicon.

3. A method of producing monocrystalline semiconductor material in web form which comprises the steps of providing a source of polycrystalline semiconductor material in elongated form, heating the end thereof to produce a molten pool thereon having a width no greater than that of the semiconductor material, contacting the molten pool of semiconductor material with a thermal profile shaping member of the same semiconductor material as the material to be produced, contacting the pool near the area contacted by the thermal profile shaping member with a seed crystal of approximately the shape of the web to be formed and withdrawing the seed crystal from the pool of molten material as monocrystalline semiconductor material is grown thereon.

4. A method as recited in claim 3 wherein said semiconductor material is silicon.

* * * * *